US008468428B1

(12) United States Patent
Matache

(10) Patent No.: US 8,468,428 B1
(45) Date of Patent: Jun. 18, 2013

(54) EARLY STOPPING RULES FOR NON-BINARY TURBO CODES

(75) Inventor: Adina Matache, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 1372 days.

(21) Appl. No.: 12/170,129

(22) Filed: Jul. 9, 2008

Related U.S. Application Data

(60) Provisional application No. 60/949,144, filed on Jul. 11, 2007.

(51) Int. Cl.
*H03M 13/45* (2006.01)

(52) U.S. Cl.
USPC ........................................... 714/780

(58) Field of Classification Search
USPC .................................. 714/755, 780
See application file for complete search history.

(56) References Cited

U.S. PATENT DOCUMENTS 7,849,377 B2 * 12/2010 Hekstra et al. ............... 714/752
8,024,644 B2 * 9/2011 Shen ............................. 714/774

OTHER PUBLICATIONS

Benedetto, S., et al., "Soft-Output Decoding Algorithms in Iterative Decoding of Turbo Codes," *Telecommunications and Data Acquisition (TDA) Progress Report*, vol. 42, No. 124, pp. 63-87, Feb. 15, 1996.
Gilbert, F., et al., "Low Complexity Stopping Criteria for UMTS Turbo-Decoders," in Proc. 2003-Spring Vehicular Technology Conference (VTC Spring '03), vol. 4, pp. 2376-2380, Jeju, Korea, Apr. 2003.
Matache, A., et al., "Stopping Rules for Turbo Decoders," *JPL TMO Progress Report*, vol. 42, No. 142, Aug. 2000.
Mouhamedou, Y.O.C., "On Distance Measurement Methods for Turbo Codes," Ph.D. Thesis, McGill University, Nov. 2005.
Ryan, W.E., "A Turbo Code Tutorial," unpublished paper available at http://telsat.nmsu.edu/~wryan/.

* cited by examiner

*Primary Examiner* — Stephen M Baker

(57) ABSTRACT

Methods and apparatus are provided for utilizing early stopping rules for non-binary turbo codes. Data can be received from a channel and decoded using a non-binary turbo code to generate extrinsic information and a posteriori information. The generated extrinsic information can be evaluated using an early stopping rule. A hard decision on a value of the received data can be made using the a posteriori information if the early stopping rule is satisfied.

25 Claims, 11 Drawing Sheets

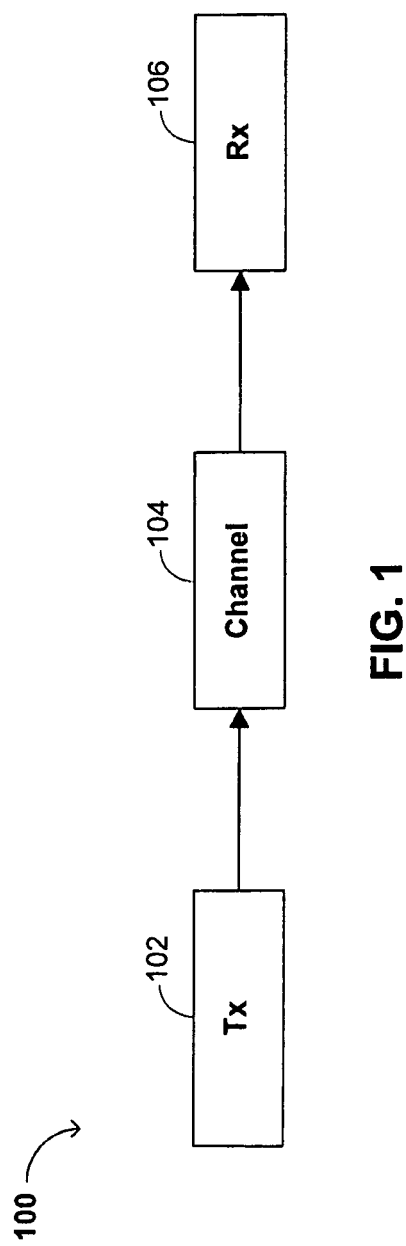

Stopping Rule 1:

$$\min_{1 \leq k \leq K} \left\{ \max_u \left\{ L_{ex}^i (u_k = u) \right\} - \text{second\_max}_u \left\{ L_{ex}^i (u_k = u) \right\} \right\} \geq \Theta$$

FIG. 5A

Stopping Rule 2:

$$\min_{1 \leq k \leq K} \left\{ A_{1k}, A_{2k} \right\} \geq \Theta, \text{ where}$$

$$A_{1k} = \max_u \left\{ L_{ex1}^i (u_k = u) \right\} - \text{second\_max}_u \left\{ L_{ex1}^i (u_k = u) \right\}$$

$$A_{2k} = \max_u \left\{ L_{ex2}^i (u_k = u) \right\} - \text{second\_max}_u \left\{ L_{ex2}^i (u_k = u) \right\}$$

FIG. 5B

EARLY STOPPING RULES FOR NON-BINARY TURBO CODES

CROSS-REFERENCE TO RELATED APPLICATION

This application claims the benefit of provisional application No. 60/949,144, filed Jul. 11, 2007, which is hereby incorporated by reference herein in its entirety.

BACKGROUND OF THE INVENTION

This invention can relate to turbo codes. More particularly, this invention can relate to using early stopping rules with non-binary turbo codes.

Reliable and efficient transmission of data across potentially noisy channels is a key challenge in modern technology. To help achieve this goal, various encoding and decoding schemes have been developed, whereby the data to be transmitted is encoded with additional, redundant information. This redundancy can be examined at a receiving circuit to identify and, in some circumstances, correct errors that may have been introduced during transmission. After examining the received data in conjunction with the received redundancy, the receiving circuit can decode the data to generate a guess as to the value of the original unencoded data.

As an example, some well-known encoding techniques can include the use of checksums. A checksum can include one or more bits added to a data word, whose value is the modular sum of all the bits in that word or a portion of that word. Decoding circuitry at a receiving circuit can verify that the data stored in a given word is consistent with the checksum and take appropriate action if an error is detected.

Some encoding techniques permit not only detection, but also correction, of data errors introduced during transmission. For instance, multiple checksums can be applied to overlapping regions of a given data word. With this technique, a single-bit data error will generally result in two incorrect checksums, allowing identification of the corrupted bit. Moreover, one incorrect checksum can be interpreted as an error in the checksum itself, and not in any of the memory data bits. Checksums and similar redundancy-adding data that is generated during the encoding process shall be collectively referred to herein as "parity data," while the original data to be encoded, transmitted, decoded, and checked shall be referred to herein as "systematic data."

Another encoding technique that can be used to improve reliability of data transmission includes interleaving of data. This technique is based on the observation that data corruptions often occur in localized areas of a data stream, meaning blocks of consecutive bits are often corrupted together, making it relatively likely that a given corrupted data word will have several corrupted bits and create difficulty in effectively decoding the word. In order to lessen the chance that more than one bit will be inadvertently changed in a single data word, decoders often interleave the data bits by shifting them within the data stream such that the bits of any given word are no longer adjacent to each other, but rather are dispersed more widely. As such, receiver circuitry that decodes the received data can perform interleaving, de-interleaving, or both.

One category of encoding and decoding standards that has been developed is turbo codes. Turbo codes can be, for example, forward-error-correction codes that can be decoded by an iterative turbo decoder that can operate in a plurality of iterations. The data decoding can stop, for instance, after a certain maximum number of iterations has been performed. Traditional binary turbo codes, where data is represented with binary bits having only two possible values (logical "0" or logical "1"), can also apply early stopping rules when decoding received data. An early stopping rule can test for a certain condition at the end of each iteration and halt the decoding process when the condition is satisfied, even if the maximum number of decoding iterations has not yet been reached. Such early stopping rules can advantageously improve decoding speed, while sacrificing little or no accuracy in decoding.

Many systems today utilize non-binary turbo codes, where each unit of data is represented by a "symbol" with more than two possible values, rather than by a bit. Such non-binary turbo codes can be used, for instance, in the 802.16 transmission standard of the Institute of Electrical and Electronics Engineers ("IEEE"). One illustrative IEEE 802.16 standard that can be used in systems is the WiMax standard. Because non-binary turbo codes have, to date, not been as widely used as binary turbo codes, techniques for optimizing their efficiency and performance have not been as well-developed as those for binary turbo codes.

SUMMARY OF THE INVENTION

In accordance with this invention, methods and apparatus are provided for utilizing early stopping rules with non-binary turbo codes. In some embodiments of the present invention, a method for decoding data can include receiving the data from a channel and decoding the received data using a non-binary turbo code to generate extrinsic information. The extrinsic information can be evaluated using an early stopping rule. If the early stopping rule is satisfied, a hard decision can be made on a value of the received data using the extrinsic information.

Similarly, in some embodiments of the present invention, circuitry for decoding data can include decoder circuitry operable to receive the data from a channel and decode the received data using a non-binary turbo code to generate extrinsic information. The circuitry for decoding data can also include control circuitry coupled to the decoder circuitry. The control circuitry can be operable to evaluate the generated extrinsic information using an early stopping rule, and cause the decoder circuitry to make a hard decision on a value of the received data using the extrinsic information if the early stopping rule is satisfied. (As used herein, the term "coupled" should be understood to generically encompass both direct and indirect connections between two structures, including physical connection through intermediate mechanical modules, electrical modules, or any other suitable components or combinations thereof, as well as connections that occur through communication passing through electrical modules, wiring, air, or any other suitable medium or combination thereof.)

In some embodiments of the present invention, evaluating the generated extrinsic information using an early stopping rule can include determining a maximum log-likelihood ratio and a second-highest log-likelihood ratio for each symbol in a codeword of the received data. A minimum difference between the maximum log-likelihood ratio and the second highest log-likelihood ratio for any symbol in the codeword of the received data can be determined. That minimum difference can be compared to a threshold, for example, to determine if the minimum difference is greater than or equal to the threshold.

The invention therefore advantageously provides methods and apparatus for utilizing early stopping rules for non-binary turbo codes.

BRIEF DESCRIPTION OF THE DRAWINGS

The above and other features and advantages of the invention will be apparent upon consideration of the following detailed description, taken in conjunction with the accompanying drawings, in which like reference characters refer to like parts throughout, and in which:

FIG. 1 is a block diagram showing an illustrative data system in accordance with embodiments of the invention;

FIG. 2 is a diagram showing an illustrative non-binary codeword in accordance with embodiments of the invention;

FIG. 5A is a diagram showing an illustrative stopping rule in accordance with embodiments of the invention;

FIG. 5B is a diagram showing another illustrative stopping rule in accordance with embodiments of the invention;

DETAILED DESCRIPTION OF THE INVENTION

Figure 3:
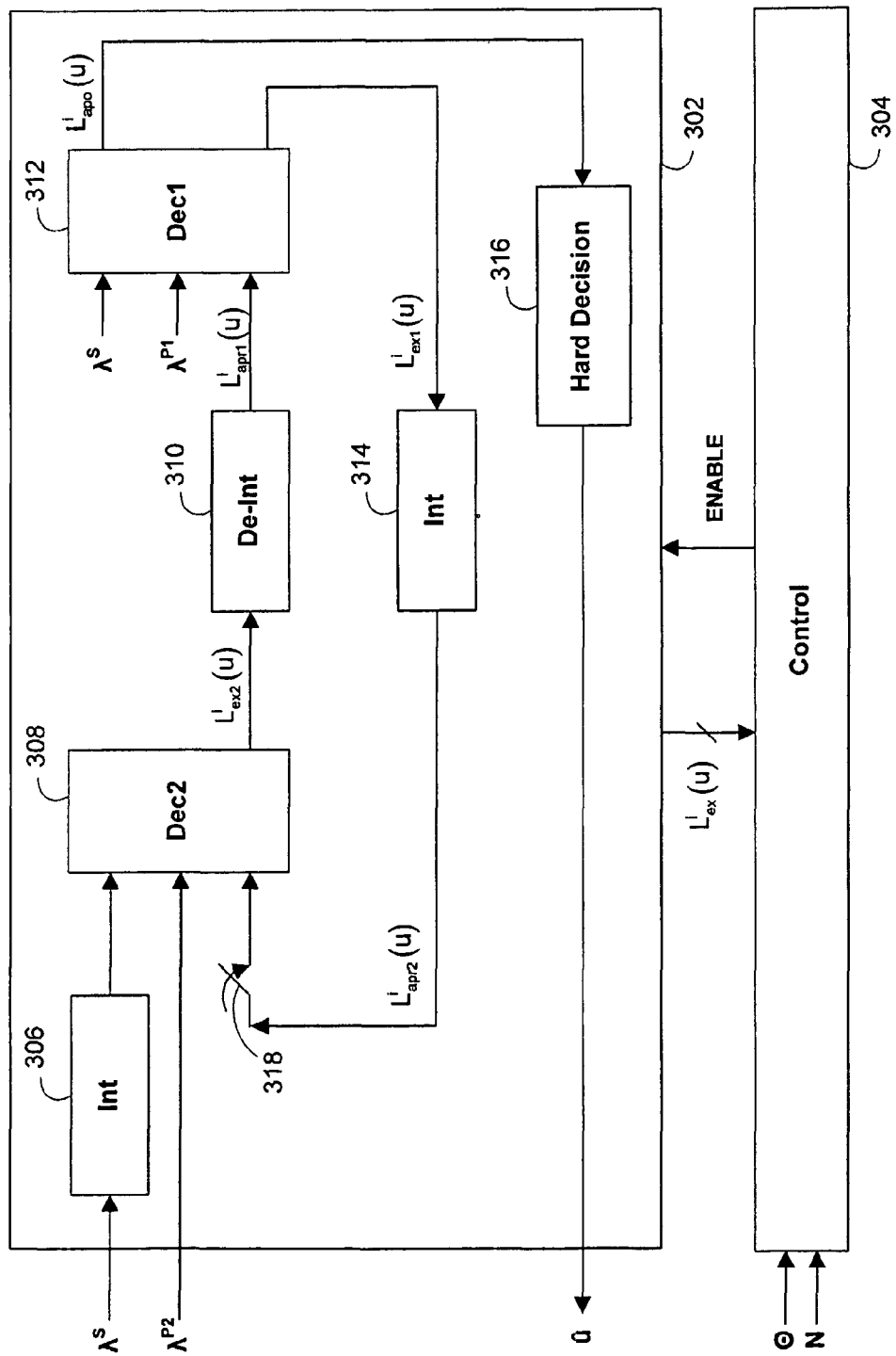
FIG. 3 is a block diagram showing illustrative decoder circuitry and control circuitry in accordance with embodiments of the invention.

FIG. 1 is a block diagram showing an illustrative data system 100 in accordance with embodiments of the invention. Transmitting circuitry 102 can be operable to encode data for transmission using any suitable techniques. For instance, transmitting circuitry 102 can encode words of systematic data by computing corresponding parity data (e.g., checksums for one or more potentially overlapping parts of the systematic data) and appending the parity data to the systematic data. As another example, transmitting circuitry 102 can perform interleaving within or across different codewords in order to reduce the chance that a given codeword will have an error that cannot be identified or repaired. Transmitting circuitry 102 can also perform other operations in order to facilitate the transmission of data, such as signal pre-emphasis or additional encoding (e.g., using a standard such as eight-bit-ten-bit, or "8B10B" encoding). Transmitting circuitry 102 can be operable to transmit binary data, non-binary data, or both, and can support any suitable communication codes, such as IEEE 802.16 codes (e.g., WiMax). Additionally, transmitting circuitry 102 can use any suitable communication signaling standards, such as low-voltage differential transmission ("LVDS") or current mode logic ("CML").

Encoded data is transmitted by transmitting circuitry 102 across channel 104, which may or may not introduce noise, jitter, or both into the data. Signal corruption introduced by channel 104 can, in some cases, change the value of at least one bit or symbol crossing channel 104, or at least make it harder to detect the true (original) value of the at least one bit or symbol. Channel 104 can include any suitable combination or electrical wiring, air (e.g., in the case of wireless transmission), or intermediate devices.

Receiving circuitry 106 can receive the transmitted codewords from channel 104 and perform any appropriate decoding operations. For instance, receiving circuitry 106 can compare the received systematic data to the received parity data and determine if there are any discrepancies that indicate that an error may have occurred. If such discrepancies are detected, receiving circuitry 106 can use the information available to determine what the likely error was, and thereby attempt to guess what the original data should have been. In accordance with embodiments of the invention, receiving circuitry 106 can include decoder circuitry that can compute a likelihood that any given bit or symbol is equal to a particular value, and use the likelihoods computed across a received codeword to make decisions about the most likely value of the transmitted data. In accordance with embodiments of the invention, decoding operations can occur in multiple steps, in multiple iterations, or both.

Decoding performed at receiving circuitry 106 can include any appropriate operations, including operations designed to reverse at least some of the processing that was performed at transmitting circuitry 102. For instance, decoding circuitry 106 can perform interleaving, de-interleaving, or both. Decoding circuitry 106 can be operable to receive binary data, non-binary data, or both, and can support any suitable communication codes, such as IEEE 802.16 codes (e.g., WiMax). Additionally, receiving circuitry 106 can use any suitable communication signaling standards, such as LVDS or CML.

FIG. 2 is a diagram showing an illustrative non-binary codeword 202 in accordance with embodiments of the invention. Illustrative codeword 202 includes K symbols $u_1$, $u_2$, ... $u_k$, ... $u_{K-1}$, $u_K$, each of which can take one of four possible values ranging from 0 to 3. Although illustrative codeword 202 utilizes symbols with four possible values for ease of discussion, it will be appreciated that concepts of the invention can be used with codewords using symbols with a different number of possible values (e.g., four, eight, or sixteen). Similarly, concepts of the invention can be applied to codewords of any suitable length K, and the invention is not limited in this respect.

FIG. 3 is a block diagram showing illustrative decoder circuitry 302 and control circuitry 304 in accordance with embodiments of the invention. Decoder circuitry 302 and control circuitry 304 can be used in receiving circuitry 106 of FIG. 1. Decoder circuitry 302 can be operable to receive a codeword with systematic data $\lambda^S$ and parity data $\lambda^{P1}$ and $\lambda^{P2}$, and be operable to generate an estimate û of the systematic data that was originally transmitted (e.g., by transmitting circuitry 102 of FIG. 1).

Decoder circuitry 302 can include two decoders, decoder 308 and decoder 312. However, it will be understood that concepts of the invention can be applied to decoder circuitry 302 having different numbers of decoders (e.g., only a single decoder) and the invention in not limited in this respect. As shown, decoders 308 and 312 can be coupled together in a feedback loop, and used to perform successive decoding iterations. The output of decoder 308 can be referred to as the result of a "half iteration," while the output of decoder 312 can be referred to as the result of a "full iteration."

Interleaver 306 can be operable to receive systematic data $\lambda^S$ and generate second data that is output to decoder 308. Decoder 308 can also be operable to receive parity data $\lambda^{P2}$. At the beginning of the first decoding iteration of a new codeword, switch 318 can be open, such that decoder 308 does not accept an input from interleaver 314. From the second iteration onwards, switch 318 can be closed, such that decoder 308 can be operable to receive second a priori information $L_{apr2}^i(u)$, where i can be the number of the iteration and u can be a particular value for a symbol in the codeword.

As used herein, the log-likelihood ratio of a particular symbol being equal to a particular value shall be represented by $$L(u_k = u) = \log \frac{P(u_k = u)}{P(u_k = u_{ref})}$$

where $u_{ref}$ is a particular value of $u_k$ that is chosen as a reference point. For example, in a non-binary code where each symbol can take any value between 0 and 3, one can set $u_{ref}=3$. It will be noted that $L(u_k=u_{ref})=0$ by definition.

Decoder 308 can use the inputs received by decoder 308 to decode the received interleaved systematic data and parity data, generating second extrinsic information $L_{ex2}^i(u)$, which can represent the log-likelihood ratio that any particular symbol in the received codeword equals a particular value, given the information received by decoder 308. First extrinsic information $L_{ex2}^i(u)$ can be received by de-interleaver 310, which can be operable to generate first a priori information $L_{apr1}^i(u)$ for output to decoder 312.

Decoder 312 can, in turn, be operable to receive systematic data $\lambda^S$, parity data $\lambda^{P1}$, and first a priori information $L_{apr1}^i(u)$, to generate first extrinsic information $L_{ex1}^i(u)$ in a fashion similar to decoder 308. Decoder 312 can also generate a posteriori information $L_{apo}^i(u)$ for output to hard decision circuitry 316. Hard decision circuitry 316, in turn, can be operable to generate an estimate û of the systematic data that was originally transmitted (e.g., by transmitting circuitry 102 of FIG. 1). In accordance with embodiments of the invention, control circuitry 304 can cause hard decision circuitry 316 to generate such an estimate û only after the decoding iterations of decoder circuitry 302 have terminated, by using signal ENABLE.

Interleaver 314 can be operable to receive first extrinsic information $L_{ex1}^i(u)$ and generate second a priori information $L_{apr2}^i(u)$. As discussed above, second a priori information $L_{apr2}^i(u)$ can be received by decoder 308 in all iterations of decoder circuitry 302 after the very first iteration, for example, by closing switch 318 at an appropriate point in the computations.

In accordance with embodiments of the invention, control circuitry 304 can be operable to receive extrinsic information $L_{ex}^i(u)$, which can include, in the illustrative example of FIG. 3, $L_{ex1}^i(u)$, $L_{ex2}^i(u)$ or both, and evaluate this extrinsic information using a stopping rule, to decide when to terminate the decoding iterations of decoder circuitry 302 for each particular codeword. The decision of whether to continue with further decoding iterations or to cease the iterations for the particular codeword and generate a hard decision û can be communicated to decoder circuitry 302 using signal ENABLE. In order to facilitate the making of this decision for each iteration, control circuitry 304 can be operable to receive input signal θ, which serve as a threshold that determines when the stopping rule is satisfied. Additionally, control circuitry 304 can be operable to receive input signal N, which can denote a maximum number of decoding iterations that can be performed by decoder circuitry 302 for a given codeword, even if the stopping rule has not yet been satisfied. Further illustrative details on the operation of control circuitry 304 are discussed below in connection with FIGS. 4, 5A, and 5B.

Figure 4:
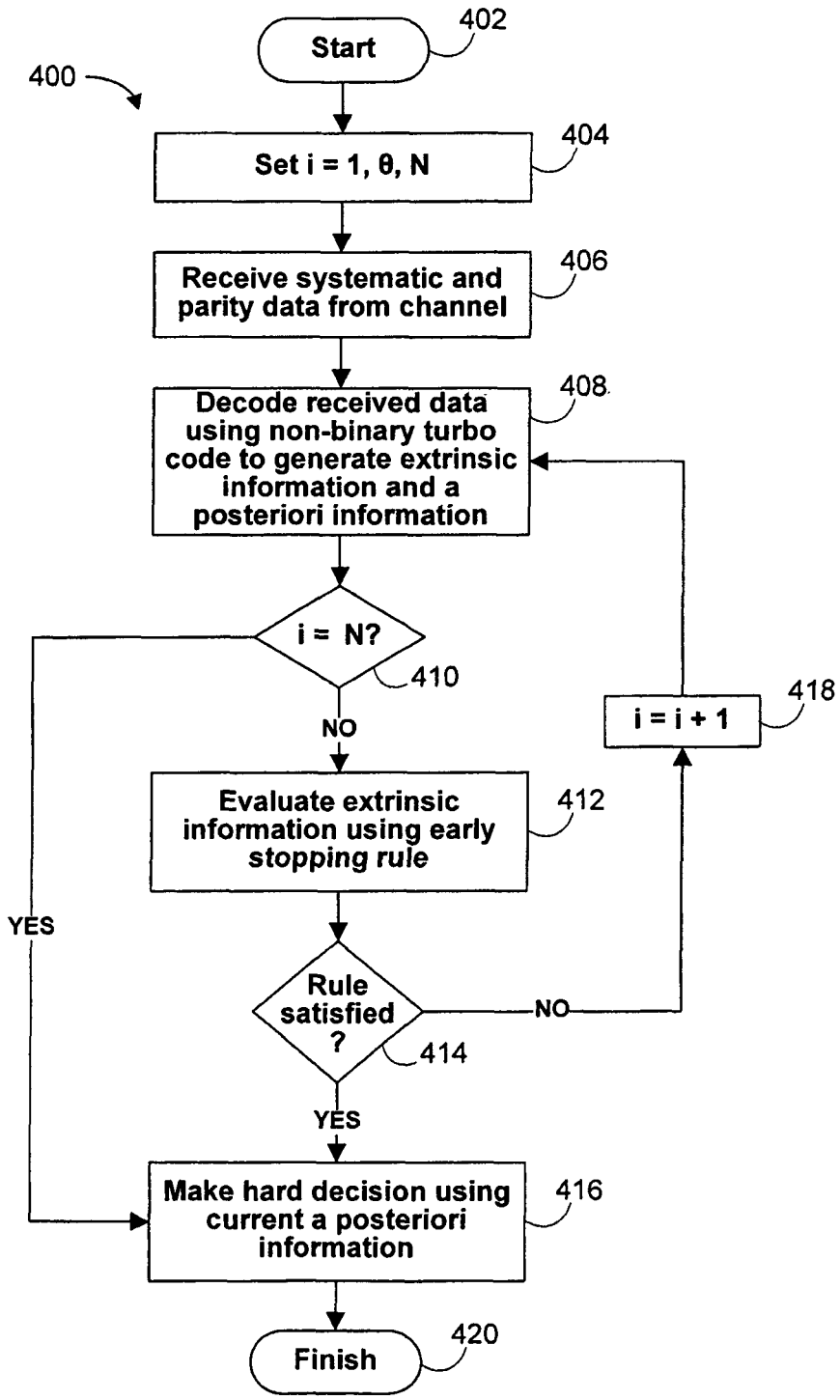
FIG. 4 is a flow chart showing an illustrative method of decoding data in accordance with embodiments of the invention.

FIG. 4 is a flow chart showing an illustrative method 400 of decoding data in accordance with embodiments of the invention. Method 400 can be performed, for example, by decoder circuitry 302 and control circuitry 304 of FIG. 3. Method 400 can start at step 402. At step 404, several variables can be initialized, for example, by setting the number of the current iteration i to 1, and by setting appropriate values for threshold θ and maximum number of iterations N. In step 406, systematic and parity data can be received from a channel. For instance, systematic data $\lambda^S$ and parity data $\lambda^{P1}$ and $\lambda^{P2}$ can be received by decoder circuitry 302 of FIG. 3. At step 408, the received data can be decoded using any appropriate non-binary turbo code, in order to generate extrinsic information, such as extrinsic information $L_{ex1}^i(u)$ and $L_{ex2}^i(u)$ of FIG. 3, and a posteriori information, such as $L_{apo}^i(u)$ of FIG. 3.

At step 410, the current iteration number i can be compared to the maximum number of iterations N that was set at step 404. If the current iteration number i is equal to N, method 400 can proceed to step 416, where a hard decision can be made to estimate the original value of the data received at step 406, using the a posteriori information of the last iteration. For example, in step 416, hard decision circuitry 316 of FIG. 3 can generate estimate û. After step 416, method 400 can terminate at step 420.

On the other hand, if at step 410 it is determined that i is not greater than or equal to N, method 400 can proceed to step 42, where the extrinsic information for the current iteration i can be evaluated using an early stopping rule. Exemplary early stopping rules that can be used in accordance with embodiments of the invention are described below in connection with FIGS. 5A and 5B. If it is determined (e.g., by control circuitry 304) at step 414 that the early stopping rule of step 412 is satisfied, method 400 can proceed to 416, where a hard decision can be made to estimate the original value of the data received at step 406 using the extrinsic information of the last iteration. For example, in step 416, hard decision circuitry 316 of FIG. 3 can generate estimate û. After step 416, method 400 can terminate at step 420. However, if it is determined at step 414 that the early stopping rule is not satisfied, method 400 can proceed to step 418, where the iteration number i can be incremented by 1, before resuming the process at step 408.

FIG. 5A is a diagram showing an illustrative stopping rule in accordance with embodiments of the invention. As illustrated in FIG. 5A, stopping rule 1 is as follows:

$$\min_{1 \le k \le K} \left\{ \max_u \{L_{ex}^i(u_k = u)\} - \text{second\_max}_u \{L_{ex}^i(u_k = u)\} \right\} \ge \theta$$

It will be noted that this stopping rule assumes that only one decoder is used for each decoding iteration, in contrast to the scenario depicted in illustrative FIG. 3. In the stopping rule presented above, $$\max_u \{L_{ex}^i(u_k = u)\}$$

can represent the maximum log-likelihood ratio of a particular symbol $u_k$ in the current codeword according to the information of the current decoding iteration i. In other words, $$\max_u \{L_{ex}^i(u_k = u)\}$$

can be the log-likelihood ratio of the most likely candidate value u for symbol $u_k$, given the extrinsic information computed in iteration i. Similarly, $$\text{second\_max}_u \{L_{ex}^i(u_k = u)\}$$

can represent the second-highest log-likelihood ratio of a particular symbol $u_k$ in the current codeword according to the information of the current decoding iteration i. Taking the difference of $$\max_{u}\{L_{ex}^{i}(u_k = u)\}$$

and $$\text{second\_max}_{u}\{L_{ex}^{i}(u_k = u)\}$$

can yield a measure of how much more likely it is for the current best candidate for symbol $u_k$ to be the correct transmitted value, compared to the second best candidate for the same symbol $u_k$. The stopping rule can thus compute the minimum such difference across all symbols in the current codeword, and compare that minimum difference to the threshold θ. If the minimum difference is at least equal to the threshold θ, then the stopping rule can be satisfied.

FIG. 5B is a diagram showing another illustrative stopping rule in accordance with embodiments of the invention. As illustrated in FIG. 5B, stopping rule 2 is as follows:

$$\min_{1 \leq k \leq K}\{A_{1k}, A_{2k}\} \geq \theta, \text{ where}$$

$$A_{1k} = \max_{u}\{L_{ex1}^{i}(u_k = u)\} - \text{second\_max}_{u}\{L_{ex1}^{i}(u_k = u)\}$$

$$A_{2k} = \max_{u}\{L_{ex2}^{i}(u_k = u)\} - \text{second\_max}_{u}\{L_{ex2}^{i}(u_k = u)\}$$

It will be noted that this stopping rule assumes that two decoders are used for each decoding iteration, as depicted in illustrative FIG. 3. $A_{1k}$ can represent the difference between the maximum log-likelihood ratio and the second-highest log-likelihood ratio at a full-iteration point (e.g., at the output of decoder 312 in FIG. 3) for a particular symbol $u_k$ in a particular iteration i. Similarly, $A_{1k}$ can represent the difference between the maximum log-likelihood ratio and the second-highest log-likelihood ratio at a half-iteration point (e.g., at the output of decoder 308 in FIG. 3) for a particular symbol $u_k$ in the same iteration i. Thus, $$\min_{1 \leq k \leq K}\{A_{1k}, A_{2k}\}$$

can represent the minimum such difference across all symbols $u_k$ in the current codeword, taking into account the extrinsic information generated by both the current half-iteration and the current full iteration. If that minimum difference is at least equal to the threshold θ, then the stopping rule can be satisfied.

Thus it is seen that methods and apparatus can be provided for utilizing early stopping rules in non-binary turbo codes. The use of early stopping rules can advantageously permit termination of the decoding of a codeword before the maximum number of iterations is reached, without substantially decreasing the accuracy of the decoding, thereby providing a substantial improvement in speed. It will be understood that the concepts described and illustrated above in connection with FIGS. 1-5B are merely illustrative, and other variations are possible. For instance, concepts of the invention can be utilized with turbo code circuitry other than decoder circuitry 302 of FIG. 3. Similarly, step 412 of FIG. 4 can include the use of several stopping rules, in which case step 414 can determine if any of the stopping rules applied has been satisfied.

As another example, the invention could utilize stopping rules based on a posteriori information instead of extrinsic information. Under such embodiments, decoder circuitries 308 and 312 of FIG. 3 could be adapted to generate a posteriori information, such as $L_{apo}^{i}(u)$, which could be transmitted to control circuitry 304. Control circuitry 304, in turn, could be operable to receive the a posteriori information and execute one or more stopping rules based on that information. As yet another example, a combination of both a extrinsic information and a posteriori information could be used. Still other implementations are contemplated and will be appreciated by those of ordinary skill in the art.

Referring now to FIGS. 6A-6G, various exemplary implementations of the present invention are shown.

Figure 6A:
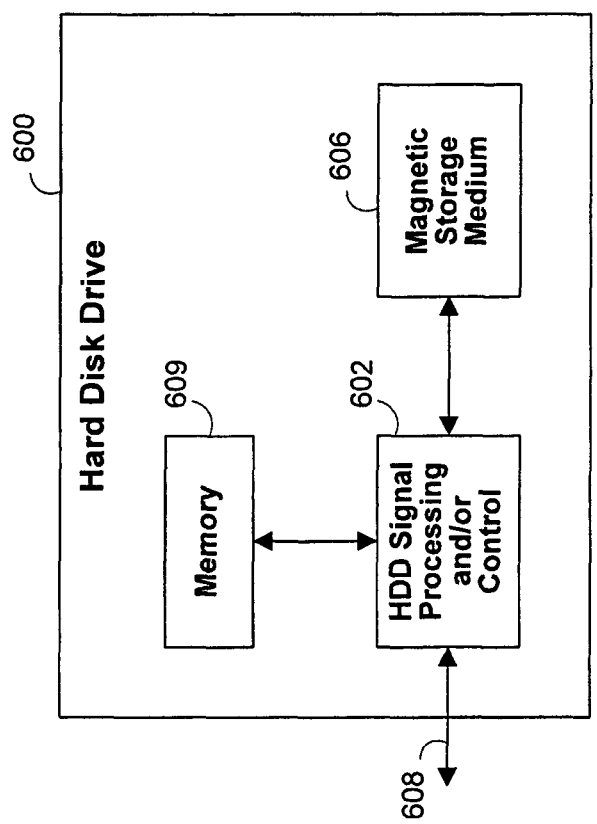
FIG. 6A is a block diagram of an exemplary hard disk drive that can employ the disclosed technology.

Referring now to FIG. 6A, the present invention can be implemented in a hard disk drive (HDD) 600. The present invention may implement either or both signal processing and/or control circuits, which are generally identified in FIG. 6A at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular phones, media or MP3 players and the like, and/or other devices via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 6B:
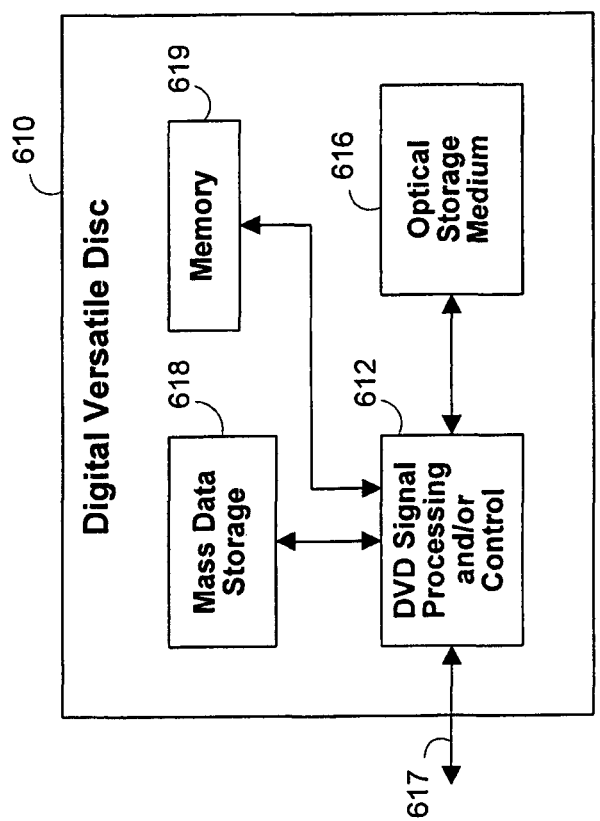
FIG. 6B is a block diagram of an exemplary digital versatile disc that can employ the disclosed technology.

Referring now to FIG. 6B, the present invention can be implemented in a digital versatile disc (DVD) drive 610. The present invention may implement either or both signal processing and/or control circuits, which are generally identified in FIG. 6B at 612, and/or mass data storage of the DVD drive 610. The signal processing and/or control circuit 612 and/or other circuits (not shown) in the DVD drive 610 may process data, perform coding and/or encryption, perform calculations, and/or format data that is read from and/or data written to an optical storage medium 616. In some implementations, the signal processing and/or control circuit 612 and/or other circuits (not shown) in the DVD drive 610 can also perform other functions such as encoding and/or decoding and/or any other signal processing functions associated with a DVD drive.

The DVD drive 610 may communicate with an output device (not shown) such as a computer, television or other device via one or more wired or wireless communication links 617. The DVD drive 610 may communicate with mass data storage 618 that stores data in a nonvolatile manner. The mass data storage 618 may include a hard disk drive (HDD). The HDD may have the configuration shown in FIG. 6A. The HDD may be a mini HDD that includes one or more platters having a diameter that is smaller than approximately 1.8". The DVD drive 610 may be connected to memory 619 such as RAM, ROM, low latency nonvolatile memory such as flash memory and/or other suitable electronic data storage.

Figure 6C:
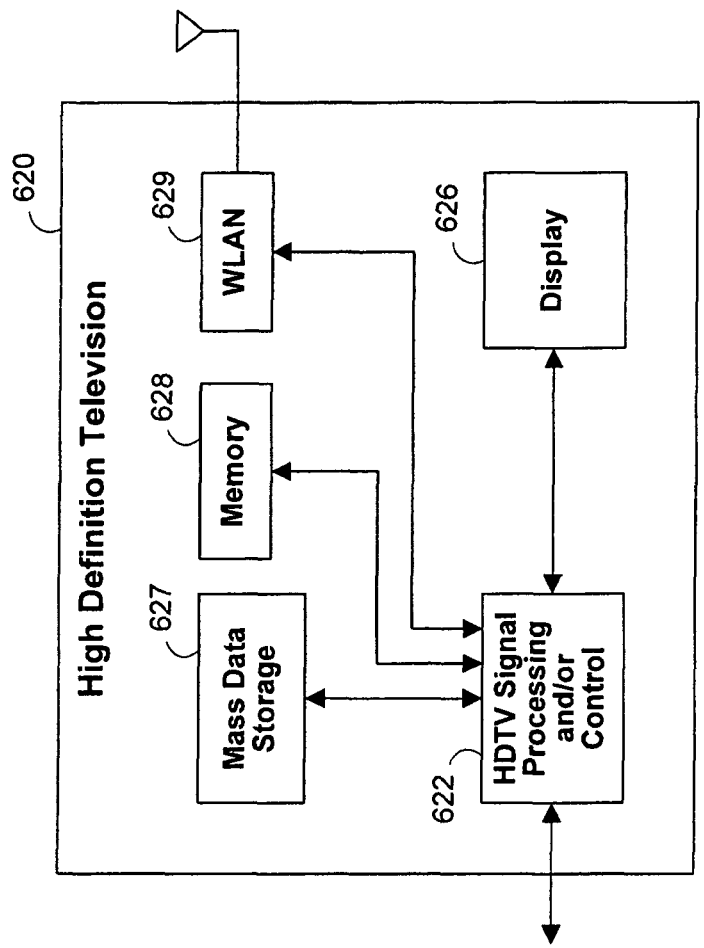
FIG. 6C is a block diagram of an exemplary high definition television that can employ the disclosed technology.

Referring now to FIG. 6C, the present invention can be implemented in a high definition television (HDTV) 620. The present invention may implement either or both signal processing and/or control circuits, which are generally identified in FIG. 6C at 622, a WLAN interface and/or mass data storage of the HDTV 620. The HDTV 620 receives HDTV input signals in either a wired or wireless format and generates HDTV output signals for a display 626. In some implementations, signal processing circuit and/or control circuit 622 and/or other circuits (not shown) of the HDTV 620 may process data, perform coding and/or encryption, perform calculations, format data and/or perform any other type of HDTV processing that may be required.

The HDTV 620 may communicate with mass data storage 627 that stores data in a nonvolatile manner such as optical and/or magnetic storage devices for example hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". The HDTV 620 may be connected to memory 628 such as RAM, ROM, low latency nonvolatile memory such as flash memory and/or other suitable electronic data storage. The HDTV 620 also may support connections with a WLAN via a WLAN interface 629.

Figure 6D:
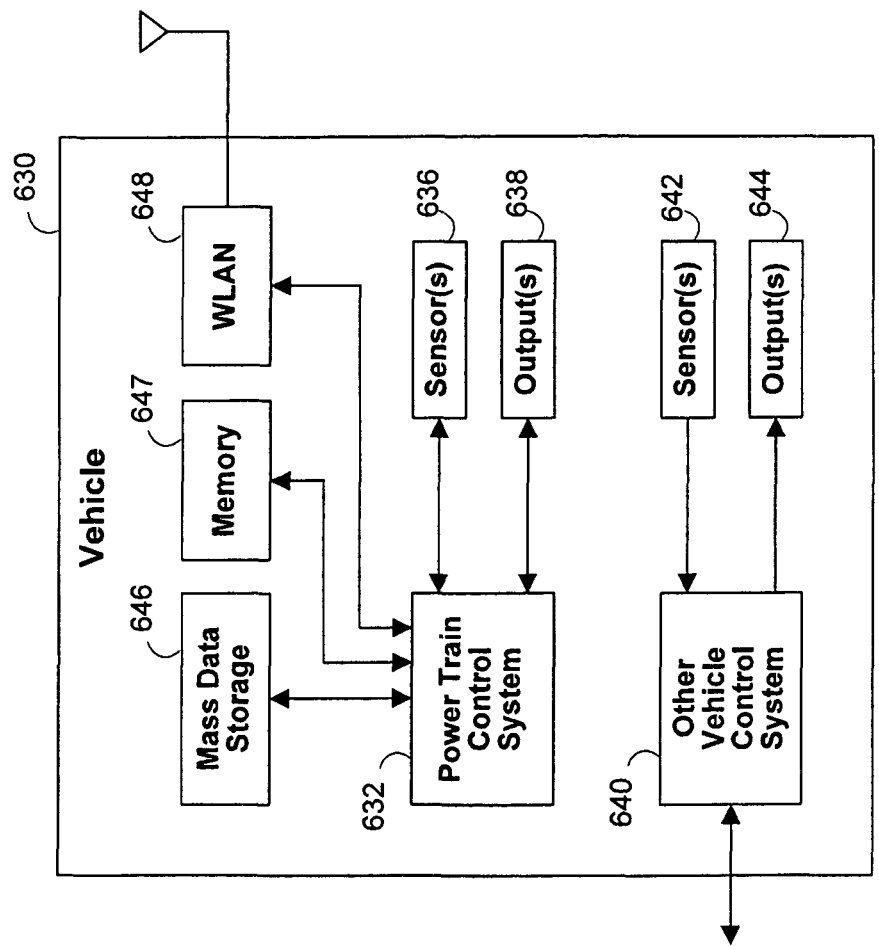
FIG. 6D is a block diagram of an exemplary vehicle that can employ the disclosed technology.

Referring now to FIG. 6D, the present invention implements a control system of a vehicle 630, a WLAN interface and/or mass data storage of the vehicle control system. In some implementations, the present invention may implement a powertrain control system 632 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in other control systems 640 of the vehicle 630. The control system 640 may likewise receive signals from input sensors 642 and/or output control signals to one or more output devices 644. In some implementations, the control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 632 may communicate with mass data storage 646 that stores data in a nonvolatile manner. The mass data storage 646 may include optical and/or magnetic storage devices for example hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". The powertrain control system 632 may be connected to memory 647 such as RAM, ROM, low latency nonvolatile memory such as flash memory and/or other suitable electronic data storage. The powertrain control system 632 also may support connections with a WLAN via a WLAN network interface 648. The control system 640 may also include mass data storage, memory and/or a WLAN interface (all not shown).

Figure 6E:
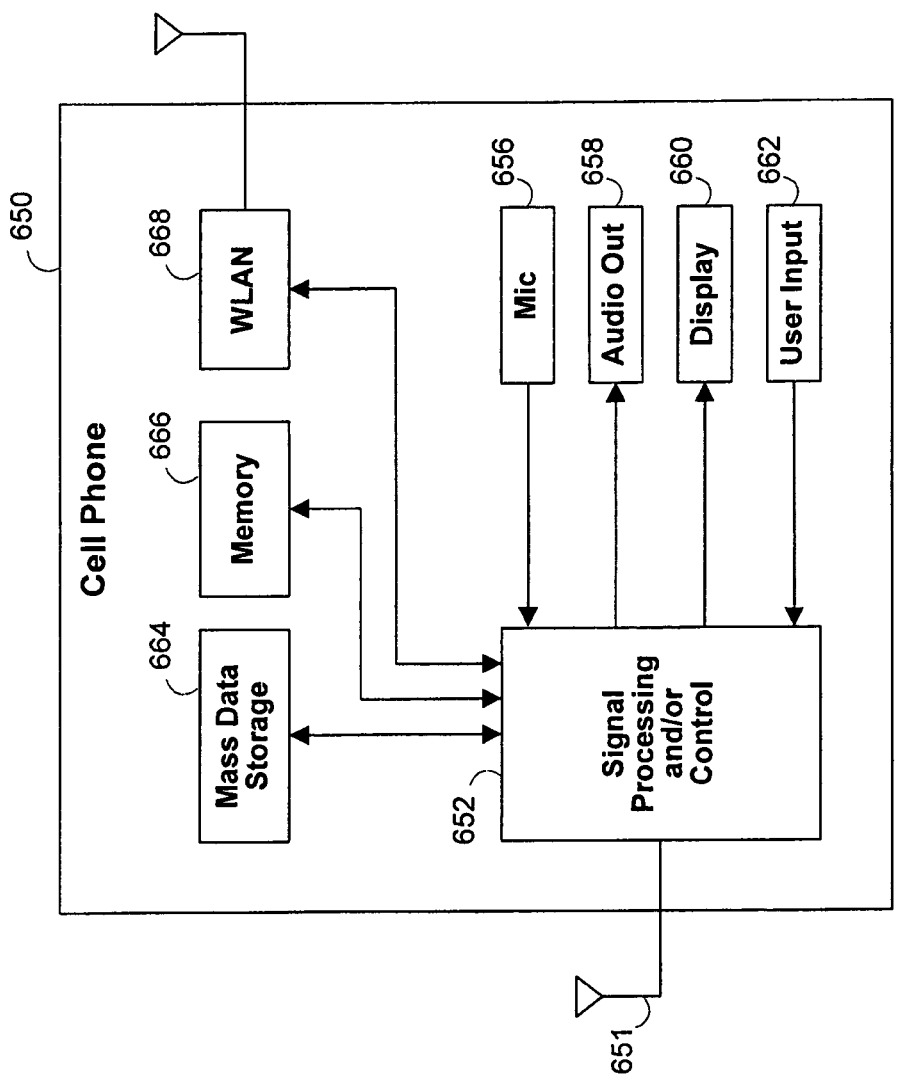
FIG. 6E is a block diagram of an exemplary cell phone that can employ the disclosed technology.

Referring now to FIG. 6E, the present invention can be implemented in a cellular phone 650 that may include a cellular antenna 651. The present invention may implement either or both signal processing and/or control circuits, which are generally identified in FIG. 6E at 652, a WLAN interface and/or mass data storage of the cellular phone 650. In some implementations, the cellular phone 650 includes a microphone 656, an audio output 658 such as a speaker and/or audio output jack, a display 660 and/or an input device 662 such as a keypad, pointing device, voice actuation and/or other input device. The signal processing and/or control circuits 652 and/or other circuits (not shown) in the cellular phone 650 may process data, perform coding and/or encryption, perform calculations, format data and/or perform other cellular phone functions.

The cellular phone 650 may communicate with mass data storage 664 that stores data in a nonvolatile manner such as optical and/or magnetic storage devices for example hard disk drives and/or DVD drives. At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 650 may be connected to memory 666 such as RAM, ROM, low latency nonvolatile memory such as flash memory and/or other suitable electronic data storage. The cellular phone 650 also may support connections with a WLAN via a WLAN interface 668.

Figure 6F:
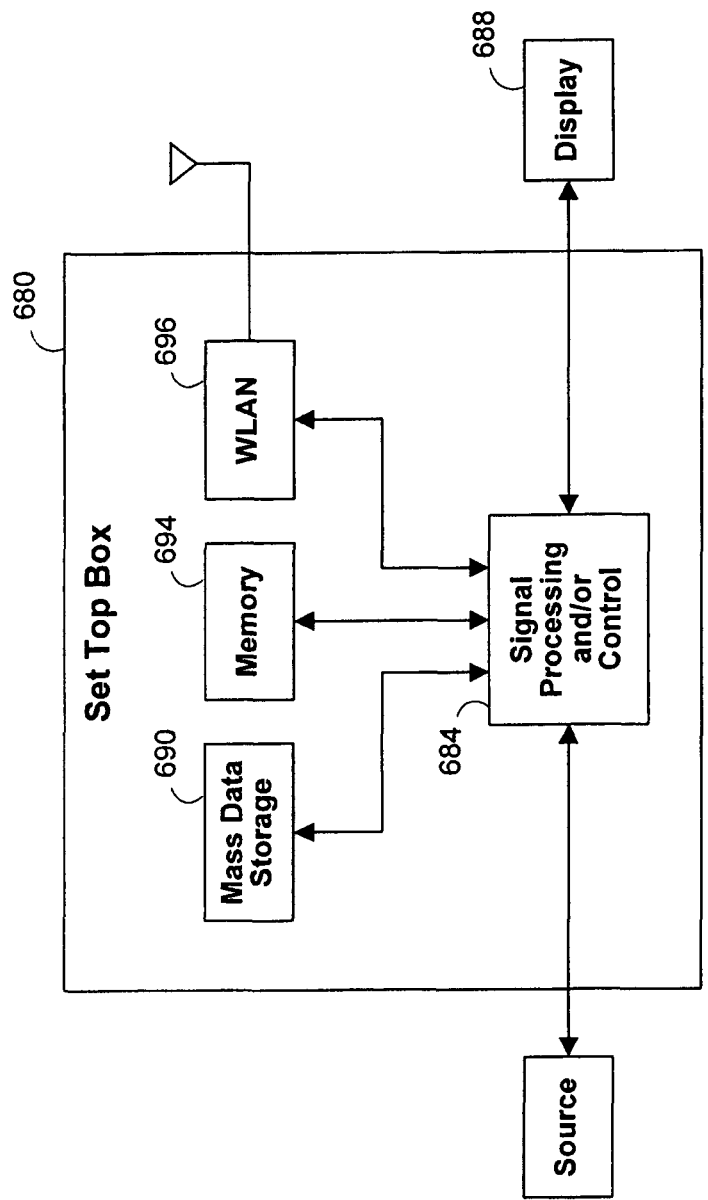
FIG. 6F is a block diagram of an exemplary set top box that can employ the disclosed technology.

Referring now to FIG. 6F, the present invention can be implemented in a set top box 680. The present invention may implement either or both signal processing and/or control circuits, which are generally identified in FIG. 6F at 684, a WLAN interface and/or mass data storage of the set top box 680. The set top box 680 receives signals from a source such as a broadband source and outputs standard and/or high definition audio/video signals suitable for a display 688 such as a television and/or monitor and/or other video and/or audio output devices. The signal processing and/or control circuits 684 and/or other circuits (not shown) of the set top box 680 may process data, perform coding and/or encryption, perform calculations, format data and/or perform any other set top box function.

The set top box 680 may communicate with mass data storage 690 that stores data in a nonvolatile manner. The mass data storage 690 may include optical and/or magnetic storage devices for example hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". The set top box 680 may be connected to memory 694 such as RAM, ROM, low latency nonvolatile memory such as flash memory and/or other suitable electronic data storage. The set top box 680 also may support connections with a WLAN via a WLAN interface 696.

Figure 6G:
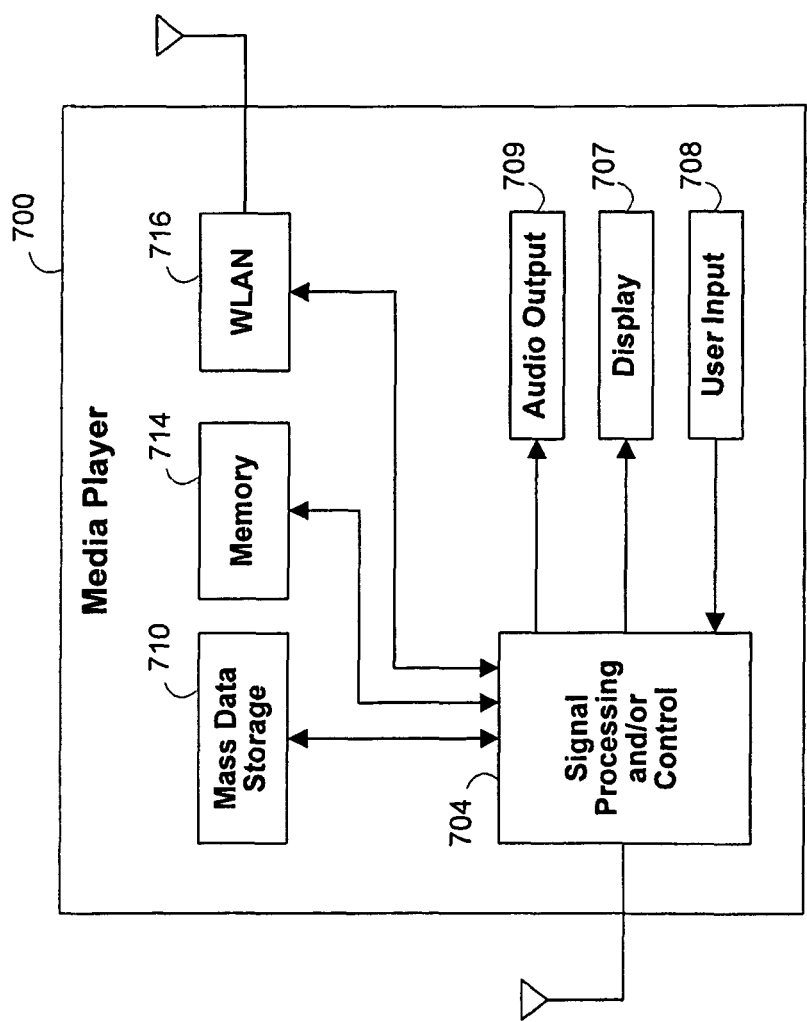
FIG. 6G is a block diagram of an exemplary media player that can employ the disclosed technology.

Referring now to FIG. 6G, the present invention can be implemented in a media player 700. The present invention may implement either or both signal processing and/or control circuits, which are generally identified in FIG. 6G at 704, a WLAN interface and/or mass data storage of the media player 700. In some implementations, the media player 700 includes a display 707 and/or a user input 708 such as a keypad, touchpad and the like. In some implementations, the media player 700 may employ a graphical user interface (GUI) that typically employs menus, drop down menus, icons and/or a point-and-click interface via the display 707 and/or user input 708. The media player 700 further includes an audio output 709 such as a speaker and/or audio output jack. The signal processing and/or control circuits 704 and/or other circuits (not shown) of the media player 700 may process data, perform coding and/or encryption, perform calculations, format data and/or perform any other media player function.

The media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". The media player 700 may be connected to memory 714 such as RAM, ROM, low latency nonvolatile memory such as flash memory and/or other suitable electronic data storage. The media player 700 also may support connections with a WLAN via a WLAN interface 716. Still other implementations in addition to those described above are contemplated.

Thus it is seen that methods and apparatus are provided for utilizing early stopping rules with non-binary turbo codes. One skilled in the art will appreciate that the invention can be practiced by other than the described embodiments, which are presented for purposes of illustration and not of limitation, and the present invention is limited only by the claims which follow.

What is claimed is:

1. A method for decoding data, the method comprising:
receiving the data from a channel;
decoding the received data using a non-binary turbo code to generate extrinsic information and a posteriori information;
evaluating the generated extrinsic information using an early stopping rule based on a maximum log-likelihood ratio, wherein evaluating the generated extrinsic information further comprises determining a difference between the maximum log-likelihood ratio and a second highest log-likelihood ratio for any symbol in the codeword of the received data; and
making a hard decision on a value of the received data using the a posteriori information if the early stopping rule is satisfied.

2. The method of claim 1 further comprising decoding the received data based on at least part of the generated extrinsic information if the early stopping rule is not satisfied.

3. The method of claim 1 wherein the hard decision is made on the value of the received data using the a posteriori information if the received data is decoded at least a pre-set number of times.

4. The method of claim 1 wherein evaluating the generated extrinsic information further comprises computing a linear function of the maximum log-likelihood ratio and a second highest log-likelihood ratio for a symbol in the codeword of the received data.

5. The method of claim 1 wherein evaluating the generated extrinsic information comprises determining the maximum log-likelihood ratio for each symbol in a codeword of the received data.

6. The method of claim 5 wherein evaluating the generated extrinsic information further comprises determining a second-highest log-likelihood ratio for each symbol in the codeword of the received data.

7. The method of claim 6 wherein evaluating the generated extrinsic information further comprises determining a minimum difference between the maximum log-likelihood ratio and the second highest log-likelihood ratio for any symbol in the codeword of the received data.

8. The method of claim 7 wherein evaluating the generated extrinsic information further comprises determining if the minimum difference is greater than or equal to a threshold.

9. The method of claim 1 wherein the extrinsic information comprises first and second extrinsic information.

10. The method of claim 9 wherein decoding the received data comprises:
decoding the received data with a first decoder to generate the first extrinsic information; and
decoding second data corresponding to the received data with a second decoder, based on second a priori information corresponding to the first extrinsic information, to generate the second extrinsic information.

11. The method of claim 10 wherein:
decoding the received data with the first decoder is based on first parity data corresponding to the received data; and
decoding the second data is further based on second parity data corresponding to the received data.

12. The method of claim 11 wherein decoding the received data further comprises interleaving the received data to generate the second data corresponding to the received data.

13. The method of claim 12 wherein decoding the received data further comprises interleaving the first extrinsic information to generate the second a priori information.

14. The method of claim 13 wherein:
decoding the received data further comprises de-interleaving the second extrinsic information to generate first a priori information corresponding to the second extrinsic information; and
decoding the received data with the first decoder is further based on the first a priori information.

15. Circuitry for decoding data, the circuitry comprising:
decoder circuitry operable to receive the data from a channel and decode the received data using a non-binary turbo code to generate extrinsic information and a posteriori information; and
control circuitry coupled to the decoder circuitry, the control circuitry being operable to:
evaluate the generated extrinsic information using an early stopping rule based on a maximum log-likelihood ratio, wherein evaluating the generated extrinsic information further comprises determining a difference between the maximum log-likelihood ratio and a second highest log-likelihood ratio for any symbol in the codeword of the received data, and
cause the decoder circuitry to make a hard decision on a value of the received data using the a posteriori information if the early stopping rule is satisfied.

16. The circuitry of claim 15 wherein the control circuitry is further operable to cause the decoder circuitry to decode the received data based on at least part of the generated extrinsic information if the early stopping rule is not satisfied.

17. The circuitry of claim 15 wherein the control circuitry is further operable to cause the decoder circuitry to make the hard decision using the a posteriori information if the received data is decoded at least a pre-set number of times.

18. The circuitry of claim 15 wherein the control circuitry is further operable to determine a minimum difference between a maximum log-likelihood ratio and a second highest log-likelihood ratio for any symbol in the codeword of the received data.

19. The circuitry of claim 18 wherein the control circuitry is further operable to determine if the minimum difference is greater than or equal to a threshold.

20. The circuitry of claim 15 wherein the extrinsic information comprises first and second extrinsic information.

21. The circuitry of claim 20 wherein the decoder comprises:
- a first decoder for decoding the received data to generate the first extrinsic information; and
- a second decoder for decoding second data corresponding to the received data, based on second a priori information corresponding to the first extrinsic information, to generate the second extrinsic information.

22. The circuitry of claim 21 wherein:
- the first decoder is operable to decode the received data based on first parity data corresponding to the received data; and
- the second decoder is further operable to decode the second data based on second parity data corresponding to the received data.

23. The circuitry of claim 22 wherein the decoder circuitry further comprises a first interleaver coupled to the second decoder, the first interleaver being operable to receive the received data and generate the second data for output to the second decoder.

24. The circuitry of claim 23 wherein the decoder circuitry further comprises a second interleaver coupled between the first and second decoders, the second interleaver being operable to receive the first extrinsic information and generate the second a priori information for input to the second decoder.

25. The circuitry of claim 24 wherein:
- the decoder circuitry further comprises a de-interleaver coupled between the second and first decoders, the de-interleaver being operable to receive the second extrinsic information and generate first a priori information for output to the first decoder; and
- the first decoder is further operable to decode the received data based on the first a priori information.

* * * * *